United States Patent [19]

Nakayama et al.

[11] Patent Number: 5,795,831
[45] Date of Patent: Aug. 18, 1998

[54] COLD PROCESSES FOR CLEANING AND STRIPPING PHOTORESIST FROM SURFACES OF SEMICONDUCTOR WAFERS

[75] Inventors: Izumi Nakayama, Groton; Yukio Masuda, North Andover; Richard L. Bersin, Boxford; Han Xu, Lexington; Quain Geng, Acton, all of Mass.

[73] Assignee: Ulvac Technologies, Inc., Andover, Mass.

[21] Appl. No.: 731,612

[22] Filed: Oct. 16, 1996

[51] Int. Cl.$^6$ .................................................. C23F 1/02
[52] U.S. Cl. .......................... 438/714; 438/715; 438/725; 438/727; 438/734; 156/345
[58] Field of Search .................................. 438/714, 715, 438/725, 727, 734; 156/345

[56] References Cited

U.S. PATENT DOCUMENTS

| Re. 34,583 | 4/1994 | Grief et al. | 156/643 |
|---|---|---|---|
| 4,521,717 | 6/1985 | Kieser | 315/39 |
| 4,581,100 | 4/1986 | Hatzakis et al. | 156/643 |
| 4,673,456 | 6/1987 | Spencer et al. | 156/345 |
| 4,689,112 | 8/1987 | Bersin | 156/643 |
| 4,699,689 | 10/1987 | Bersin | 156/643 |
| 4,744,860 | 5/1988 | Cop et al. | 156/643 |
| 5,007,981 | 4/1991 | Kawasaki et al. | 156/643 |
| 5,041,303 | 8/1991 | Wertheimer et al. | 427/39 |
| 5,057,187 | 10/1991 | Shinagawa et al. | 156/643 |
| 5,099,100 | 3/1992 | Bersin et al. | 219/121.4 |
| 5,164,034 | 11/1992 | Arai et al. | 156/345 |
| 5,226,056 | 7/1993 | Kikuchi et al. | 373/18 |
| 5,228,052 | 7/1993 | Kikuchi et al. | 373/18 |
| 5,244,535 | 9/1993 | Ohtsuka et al. | 156/643 |
| 5,280,154 | 1/1994 | Cuomo et al. | 219/121.52 |
| 5,298,112 | 3/1994 | Hayasaka et al. | 156/643 |
| 5,344,525 | 9/1994 | Cathey, Jr. | 156/643 |
| 5,360,995 | 11/1994 | Graas | 257/751 |
| 5,434,451 | 7/1995 | Dalal et al. | 257/768 |
| 5,445,710 | 8/1995 | Hori et al. | 156/643.1 |
| 5,476,750 | 12/1995 | Rahman et al. | 430/270 |
| 5,560,803 | 10/1996 | Mihara et al. | 438/725 |

FOREIGN PATENT DOCUMENTS

04/162624  6/1992  Japan .

OTHER PUBLICATIONS

Poulsen, R.G., "Plasma Etching in Integrated Circuit Manufacture –A Review*", *J. Vac. Sci. Technol*, vol. 14, No. 1, Jan./Feb. 1977.

Taylor, G.N. and Wolf, T.M., "Oxygen Plasma Removal of Thin Polymer Films", *Polymer Engineering and Science*, Mid–Nov. 1980, vol. 20, No. 16.

*Primary Examiner*—Deborah Jones
*Attorney, Agent, or Firm*—Hale and Dorr LLP

[57] ABSTRACT

A method for removing a resist layer includes an RIE process and a downstream microwave process, each performed such that the temperature of the wafer is no greater than about 60° C. By performing these processes cold, the resist need not be pre-heated to drive off solvents. The RIE process and the microwave process can be performed sequentially or simultaneously.

18 Claims, 3 Drawing Sheets

COLD PROCESSES FOR CLEANING AND STRIPPING PHOTORESIST FROM SURFACES OF SEMICONDUCTOR WAFERS

BACKGROUND OF THE INVENTION

This invention relates to the cleaning and stripping of photoresist from surfaces of semiconductor wafers during manufacturing.

In the manufacture of semiconductor devices on a wafer, photolithography steps and etching, thin film deposition, and/or ion implantation steps are alternately performed to build up the devices. The photolithography steps typically include steps of coating a wafer with a photoresist, such as an ultraviolet (UV) photosensitive organic material; heating the photoresist to a temperature of about 100° C. to 200° C. to drive off solvents; exposing the photoresist through a mask; developing the resist; and etching the exposed resist to leave certain areas on the wafer surface exposed. Further processing steps, such as deposition, implantation, or etching can then be employed on the exposed areas. After these subsequent processing steps are performed, the photoresist is stripped so that further steps can be performed.

To strip the photoresist film, there are wet treatment methods in which chemicals, such as hydrogen peroxide or organic solvents, are used; and dry treatment methods in which the photoresist film is ashed by using a plasma. In the wet treatment method, attention must be paid to safety; because impurities adhere to the substrate, this method is not suitable to fine fabrication of VLSI circuits. In the dry treatment method, a photoresist film of CxHyNz coated on the substrate is removed by causing it to react with oxygen radicals generated in the oxygen plasma, thereby decomposing and evaporating it into $CO_2$, $NO_2$, and $H_2O$. Therefore, such methods do not have the same problem of safety and adhesion of impurities, and thus are suitable to the fine fabrication of the substrate. In this case, however, the substrate and the photoresist film typically must be heated to react with the radicals.

When the substrate coated with the photoresist film is subjected to the irradiation of ion beams, the surface layer of the photoresist film is usually affected and hardened. Consequently, stresses accumulate inside the photoresist film. Should the substrate be heated suddenly, the photoresist film can explode, in which case flakes of the photoresist film stay on the substrate or inside a vacuum treatment chamber as dust and residual matter, and become obstacles to the fabrication of the substrate and particle free system. The lower limit temperature of explosion of the photoresist film is from about 60° C. to 160° C., although the limit can vary with the baking condition of the film.

In other situations, heating of the substrate should be avoided to prevent diffusion. Consequently, dry ashing at low temperature is desirable. If ashing is performed with oxygen downstream plasma at low temperature, however, the rate of ashing is very low. Such a process is therefore inappropriate when the substrate temperature is below 160° C.

OBJECTS AND SUBJECT OF THE INVENTION

It is an object of the present invention is to provide processes for stripping resist at low temperature.

It is another object to provide a method for stripping resist that has not been pre-heated.

The present invention includes cold processes for removing resist, a "cold" process being one in which the wafer is not heated above about 50° C.–60° C., i.e., temperatures below which solvents are not driven from the resist. These processes are preferably performed in a processing chamber such as that described in U.S. Pat. No. 5,228,052, which allows microwave downstream plasma etching or reactive ion etching (RIE) to be performed alternatively or sequentially on wafers in a single process chamber. The chamber shown in that patent is preferably altered to allow simultaneous RIE and downstream processes, and also to improve control of heights at which the wafer is positioned over a hot plate to better control the heat of the wafer, as described in application Ser. No. 08/503,732, which is expressly incorporated by reference for all purposes.

The present invention includes a method of performing an RIE process and a microwave downstream process on a semiconductor wafer with each of these processes performed at no greater than about 50° C.–60° C. These processes can be performed sequentially in this order, or they can be performed simultaneously, even at temperatures as low as 15° C. The processes of the present invention ash photoresist and render any unashed residues much more readily soluble in water than those resulting from conventional ashing processes. Such solubility eliminates the need for costly and hazardous acids and organize solvents, making deionized (DI) water the only liquid process step required. These methods also shorten processing time and thereby increase the wafer throughput over costly wet-processing equipment.

In another aspect of the present invention, the invention includes an apparatus that has a treatment chamber for enclosing a wafer with a resist layer to be ashed, a cathode for connection to an RF source and positioned near the wafer, and an inlet pipe for connection to a gas source for receiving a microwave plasma. The treatment chamber does not enclose any external heat source, and thus the ashing processes are performed at ambient temperatures. This apparatus is less expensive to produce because it omits the heater, although it does mean that the treatment chamber without the heater is dedicated to cold processes. The apparatus of the present invention can be used with a single cathode or a double cathode arrangement as described, for example, in U.S. Pat. No. 5,228,052, which is expressly incorporated by reference for all purposes, and particularly in FIGS. 2 and 3 of that patent. In FIG. 2 of that patent, a second electrode 12 is shown grounded, although this second electrode can be omitted entirely.

Stripping at low temperature has a number of advantages. The residues of ashing are kept in a water soluble form, such as chloride or fluoride, which in the case of high temperatures could revert to insoluble compounds. Such ashing also helps the manufacturer to remain within the thermal budget of the devices on the wafer, thus helping to retain the integrity of their critical electrical performance. Moreover, lower temperature helps avoid contamination that can otherwise result from stripping high-dose implanted resists at temperatures above ambient temperature. These processes also eliminate the need for heating wafers, thus allowing the resist to be used without being pre-heated, thereby reducing processing steps and cost. Other features and advantages will be apparent from the following detailed description, claims, and drawings.

DETAILED DESCRIPTION

Figure 1:
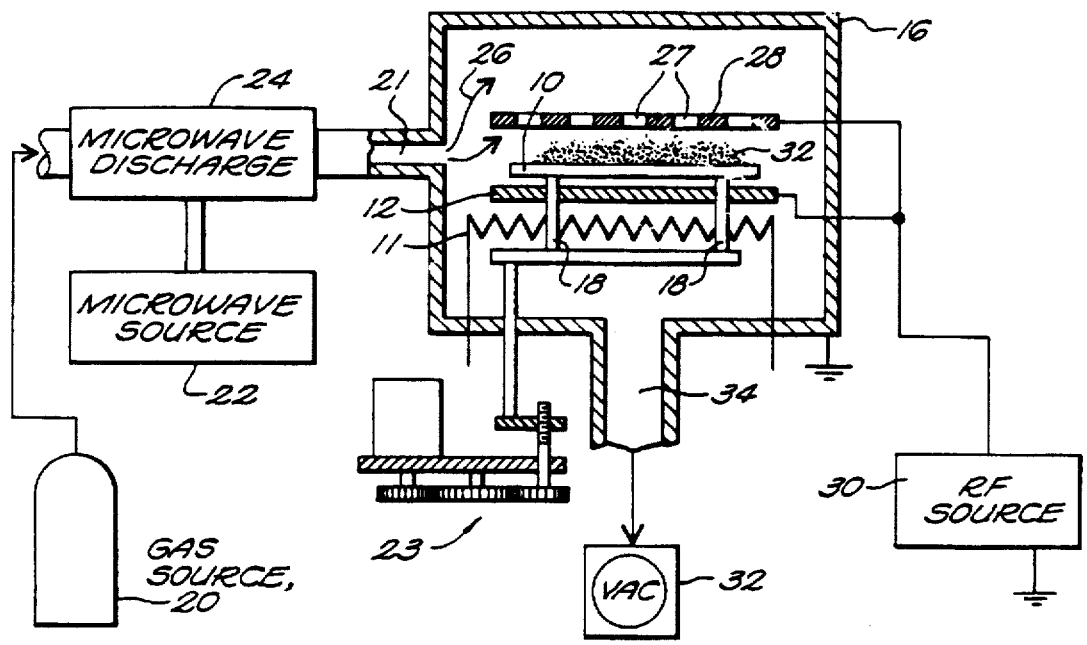
FIGS. 1–4 are partial pictorial, partial block diagrams of an apparatus for etching and stripping according to embodiments of the present invention.

Referring to FIG. 1, a semiconductor wafer 10 to be processed is positioned over a horizontally disposed cathode 12 in an enclosed treatment chamber 16 for etching and/or cleaning. Wafer 10, which is typically flat and circular with a diameter of four to eight inches, rests horizontally on support pins 18 that extend through openings in cathode 12 along its thickness direction. The height of the pins over cathode 12 is controlled by a motor-driven lifter 23. Wafer 10 and cathode 12 lie in parallel horizontal planes. Under cathode 12 is an electric heater 11 that is used to heat the wafer as desired in processes that require that the wafer be heated.

A process gas is introduced into chamber 16 from a gas source 20 through an inlet pipe 21. A microwave source 22 at inlet pipe 21 causes a microwave plasma to be formed at a microwave discharge 24 in inlet pipe 21, thus discharging a reactive gas 26 with a high concentration of active free radicals. Gas 26 passes through openings 27 in a top electrode 28 that is mounted above the wafer and configured as in the incorporated patent. Under appropriate conditions, these active free radicals can thus decompose and ash away a resist film on wafer 10 by converting the resist to gases. A vacuum 32 draws away these gases through an exhaust tube 34, and also maintains low pressure on the order of 50–2000 mTorr in the chamber.

An RF source 30 is electrically coupled to top electrode 28 and to cathode 12, which serves as a bottom electrode. Electrodes 28 and 12 thus form a double cathode. Source 30 provides an RF voltage that causes an RF plasma 32 to form over wafer 10. RF plasma 32 creates reactive ions that ash the resist from wafer 10.

A transparent cover and an end point detector (not shown) are used to detect when ashing caused by the RF plasma begins and ends. The end point detector has a filter and an optical detector for detecting photons that are released in the RF plasma when OH radicals are formed during ashing.

A gas can be introduced from gas source 20 while microwave source 22 is activated to produce reactive gas 26 having a high concentration of free radicals discharged from the microwave plasma. An RF plasma can then be generated in the microwave-generated reactive gas 26 to ionize its free radicals. If, for example, a process gas from gas source 20 includes $CF_4$ and oxygen, the discharged gas from the microwave plasma has a high concentration of fluorine and oxygen radicals, respectively, in the gas over the wafer. If an RF plasma is then initiated in this discharge gas, the resulting ions that are produced are different from those in either the microwave discharge gas itself or from an RF plasma of $CF_4$ and oxygen gas without the microwave discharge. This different plasma has been found to substantially increase ashing during either etching or stripping.

In typical wafer manufacturing, a photoresist layer is formed over the existing structure at an intermediate stage of manufacture, and the resulting structure is baked to drive off solvents in the photoresist. For reasons noted above, it can be desirable to avoid this baking step. If a semiconductor device with unbaked photoresist is processed at high temperature, however, the solvents can cause the destruction of the circuitry on the wafer and the wafer itself.

To strip the photoresist films at low temperature, a reactive gas such as oxygen gas is introduced from the gas introduction pipe that passes a free radical generator powered by the microwave source. Electric power is supplied from the RF power source to the substrate electrode, thereby generating an RF plasma. Because the incoming species are the mixture of oxygen radicals and molecules rather than the oxygen gas, the energy level and the number of oxygen radical ions generated by the RF electric potential will be much higher than with a typical RIE process. This processing provides a high photoresist stripping rate even at low temperature.

Figure 5:
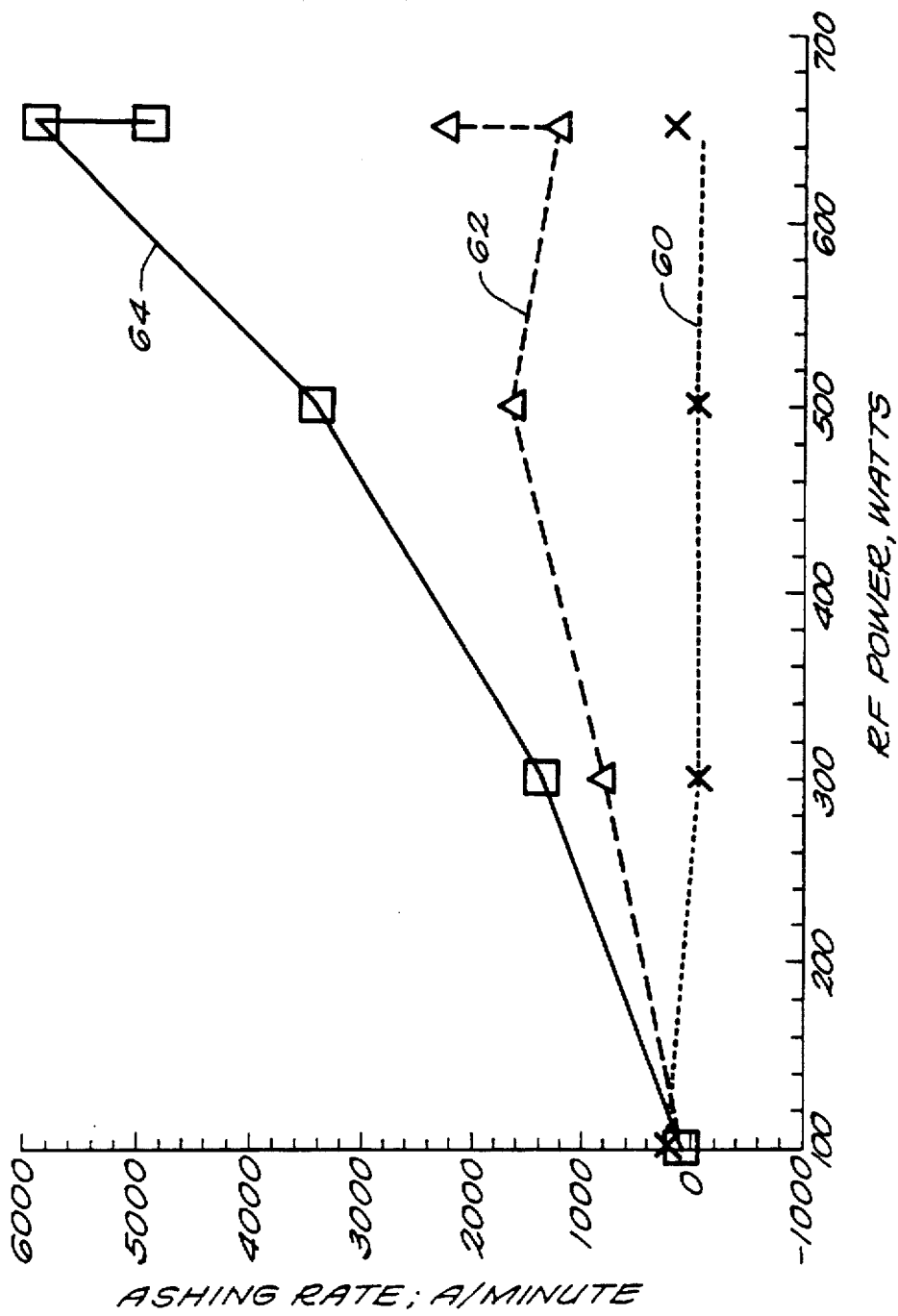
FIG. 5 is a graph illustrating a cold downstream process alone, a cold RIE process alone, and these processes performed cold together.

Referring also to FIG. 5, the graph shows ashing rates at different power levels for microwave and RIE processes separately, and for these processes performed simultaneously. A lower line 60 shows the ashing rate for microwave downstream, a middle line 62 shows the ashing rate for RIE ashing, and a top line 64 shows the combination of the two processes. A large ashing rate enhancement has thus been observed when the oxygen free radicals are first generated by a microwave generator, and then provided as an RF plasma. These measurements were made with 8 wafers at a room temperature of about 15° C. resting on cathode 12. The room temperature could be several degrees higher, and includes temperatures a little over 20° C.

To determine whether the rate enhancement was coming from the high energy ion and radical ashing rather than effect of the plasma heating the substrate, the wafer temperature was monitored during the processes. The wafer temperature in the microwave/RIE combination plasma case was slightly higher than for RIE alone, but it was still low enough (<60° C.) so that the enhancement in the rate of ashing could not be attributed to the thermal heating effect. The replacement of any other free radical provider or generator should produce the same or similar results. Thus, by combining the free radical generator and RF plasma in one chamber, high photoresist ashing rate at low temperature can be realized.

The RIE process and the downstream process can alternatively be performed sequentially at ambient temperature and successfully ash away resist, even resist that is unbaked and thus has solvents that cannot be heated significantly. In this case, the RIE process should be performed first.

For the RIE step in either of these embodiments, process variables are preferably as follows:

(1) Time duration of about 5–45 seconds.

(2) Gas has pure $CF_4$, pure $NF_3$, a mixture of $CF_4$ or $NF_3$ with $N_2H_2$ (a forming gas) with 5%–100% volume ratio of $CF_4$ or $NF_3$, pure $O_2$, a mixture of $O_2$ and $CF_4$ or $NF_3$, or a mixture of $O_2$, $CF_4$, or $NF_3$, and $N_2H_2$ at a gas flow from 50 to 500 sccm.

(3) RF power levels from 50–500 watts.

(4) Pressure of 0.1 Torr to 0.5 Torr.

In this RIE process above, $N_2H_2$ can be substituted with other forming gases such as $N_2$ or argon. The $N_2H_2$ is preferably from 0.1% to 10% $H_2$.

For the downstream plasma stripping processes, the process variables are preferably as follows:

(1) 1000 sccm oxygen.

(2) $CF_4$ or $NF_3$ from 30–200 sccm.

(3) $N_2H_2$ from 10–100 sccm in the mixture.

Following an RIE process and downstream process, an additional cold RIE process similar to the first process can be performed.

These methods render any nonvolatile residues soluble in deionized (DI) water, or at worst soluble with substantially weakened organic solvents and reduced processing time. Thus after the steps above, the wafer can be rinsed, preferably just in deionized water. Such solubility may occur after any of the following processes which can occur after photoresist is formed in a layer, exposed, developed, and etched: aluminum etching, via etching, polysilicon etching, silicon dioxide etching, silicon nitride etching, TiN etching, TiW etching, Ti etching, polycide etching, post-ion-implantation strip, and for any other processes when resist masks are utilized and a stripping step is required.

Figure 2:
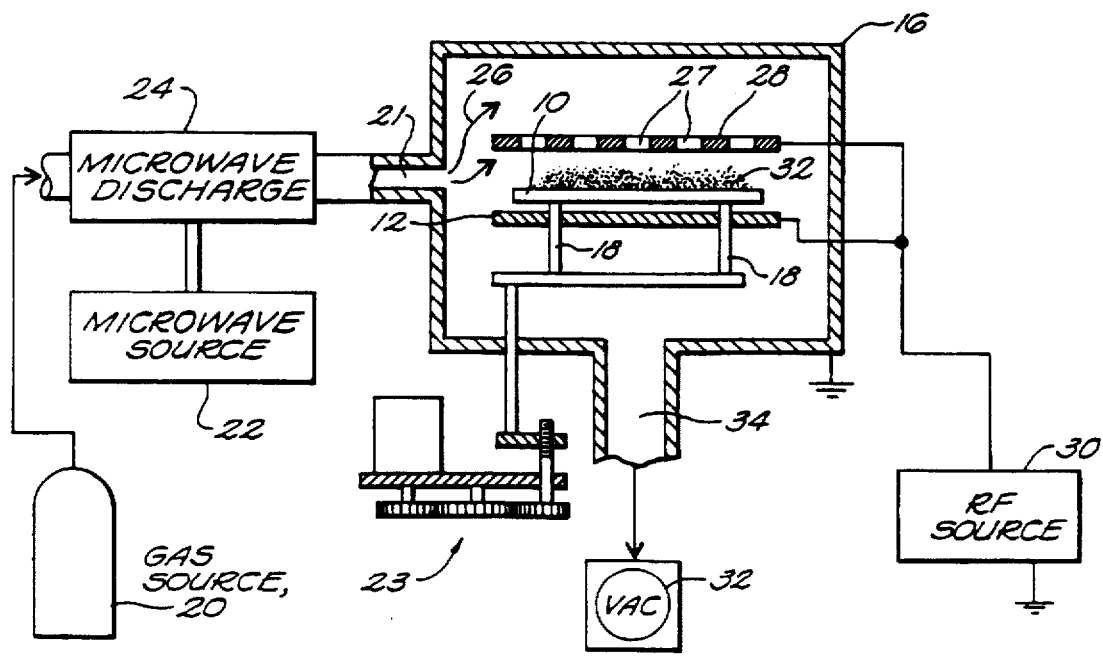
Figure 3:
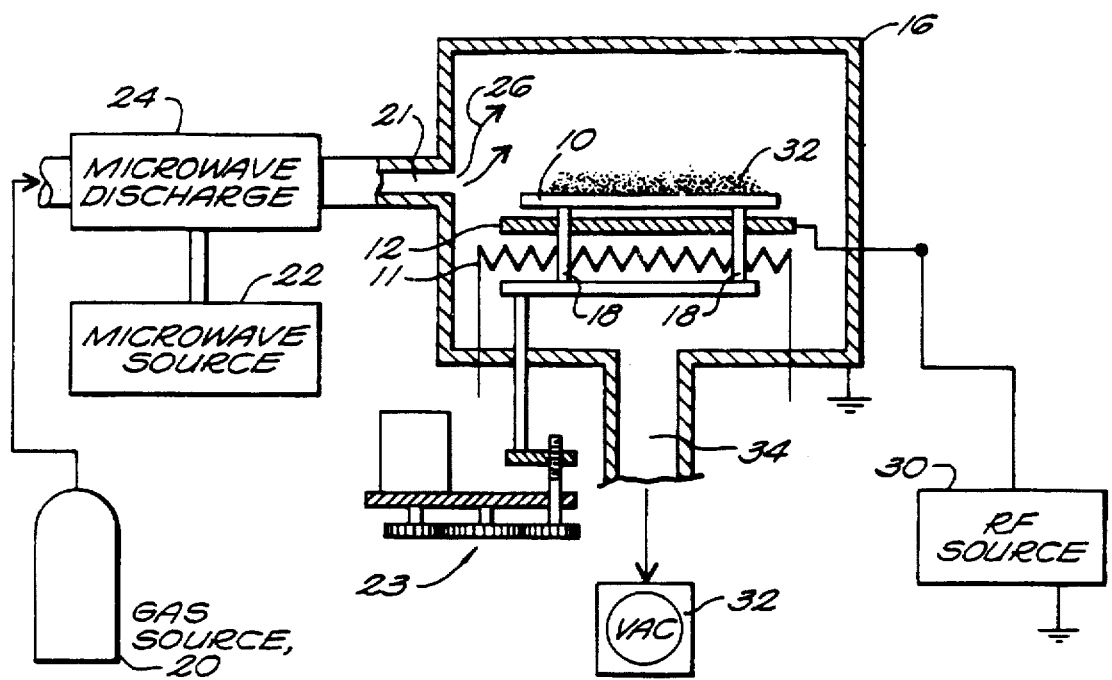
Figure 4:
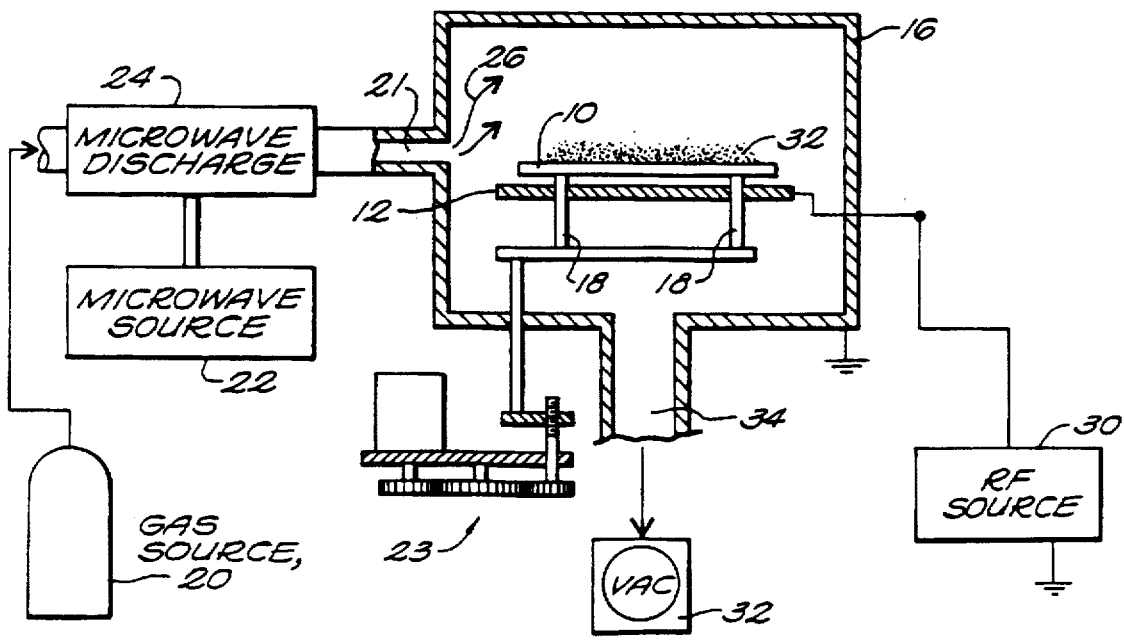

FIGS. 2–4 illustrate alternative embodiments of processing chambers according to the present invention. These embodiments result because the methods can be performed in a processing chamber with a single cathode or a double cathode arrangement, and also because the heater, while useful for providing flexibility to perform hot processes in addition to the cold processes described above, can be omitted entirely if desired, in which case the processing chamber is dedicated to cold processes.

The treatment chamber shown in FIG. 2 differs from that in FIG. 1 only in that electric heater 11 has been removed. Consequently, cathode 12 which serves as a hot plate in the embodiment of FIG. 1, here serves as just a cathode. The embodiments of FIGS. 3 and 4 are very similar to the embodiments of FIGS. 1 and 2, respectively, except that electrode 28 (and thus its connection to RF source 30) has been removed. The processing in the chambers in FIGS. 3 and 4 thus use a single cathode approach.

As noted above, the processing chamber as shown in FIGS. 2 and 4 can be dedicated to cold processing methods, and thus these processing chambers can completely omit the use of an externally controlled heat source, such as electric heater 11, for heating the wafer during processing.

Having described embodiments of the present invention, it should be apparent that modifications can be made without departing from the scope of the appended claims. For example, while certain gases are recited, other gases can be used for removing resist.

What is claimed is:

1. A method for manufacturing semiconductor devices in which the devices are in an intermediate stage of manufacture and have formed thereon a resist layer to be removed, the removal of the resist being performed in a processing chamber, the method comprising the steps of:
   (a) ashing the resist layer with a reactive ion etching (RIE) process that includes forming an RF plasma in the processing chamber; and
   (b) ashing the resist layer with a microwave downstream process including causing a microwave generated gas to be introduced into the processing chamber;
   wherein steps (a) and (b) are each performed such that the wafer is at a temperature no greater than about 60° C.

2. The method of claim 1, wherein step (b) includes a forming a microwave plasma from a mixture of oxygen, a fluorine containing gas, and forming gas.

3. The method of claim 1, wherein step (a) is performed with a gas selected from the group consisting of: $CF_4$; $NF_3$; a mixture of $CF_4$ and forming gas; a mixture of $NF_3$ and forming gas; $O_2$; a mixture of $O_2$ and $CF_4$; a mixture of $O_2$ and $NF_3$; a mixture of $O_2$, $CF_4$, and forming gas; and a mixture of $O_2$, $NF_3$, and forming gas.

4. The method of claim 1, wherein steps (a) and (b) are each performed at substantially room temperature of about 15° C.–20° C.

5. The method of claim 1, further comprising a step of providing in the processing chamber a semiconductor device with a resist layer that has not been pre-heated sufficiently to drive off solvents in the resist layer.

6. The method of claim 1, further comprising a step of ashing the resist layer with a second RIE process after step (b), the second RIE process being performed such as the wafer is heated to a temperature no greater than about 60° C.

7. The method of claim 1, wherein steps (a) and (b) are performed simultaneously so that an RF plasma of a microwave-generated gas is created.

8. The method of claim 1, wherein steps (a) and (b) are performed sequentially with step (a) prior to step (b).

9. The method of claim 1, wherein steps (a) and (b) are performed sequentially, the method further comprising a step after step (b) of performing an RIE process with a gas selected from the group consisting of $CF_4$; $NF_3$; a mixture of $CF_4$ and forming gas; a mixture of $NF_3$ and forming gas; $O_2$; a mixture of $O_2$ and $CF_4$; a mixture of $O_2$ and $NF_3$; a mixture of $O_2$, $CF_4$, and forming gas; and a mixture of $O_2$, $NF_3$, and forming gas.

10. The method of step 1, wherein step (b) includes forming a plasma of oxygen over the wafer.

11. The method of claim 1, further including a step, after steps (a) and (b) of rinsing the wafer in deionized water.

12. The method of claim 1, wherein steps (a) and (b) are performed after a step of forming a resist on a wafer, and a step of etching the wafer.

13. The method of claim 12, wherein the etching step is a process selecting from the group consisting of aluminum etching, via etching, polysilicon etching, silicon dioxide etching, silicon nitride etching, TiN etching, TiW etching, Ti etching, polycide etching, and post-ion-implantation strip.

14. A method for manufacturing semiconductor devices in which the devices are in an intermediate stage of manufacture and have formed thereon a resist layer to be removed, the removal of the resist being performed in a processing chamber, the method comprising the steps of:
   (a) ashing the resist layer with a reactive ion etching (RIE) process that includes forming an RF plasma in the processing chamber; and
   (b) ashing the resist layer with a microwave downstream process including causing a microwave generated gas to be introduced into the processing chamber;
   wherein steps (a) and (b) are each performed such that the wafer is heated to a temperature at which solvents are not driven from an unbaked resist.

15. An apparatus for ashing a resist layer from semiconductor devices at an intermediate stage of manufacture, the apparatus comprising:
   an enclosed chamber;
   a microwave energy source;
   an inlet pipe for connection to a gas source, the microwave energy source forming a microwave plasma of the gas from the gas source for introduction into the chamber;
   an RF energy source; and
   a first cathode positioned near the wafer and coupled to the RF source for producing an RF plasma in the chamber;
   wherein the treatment chamber does not enclose any externally controlled heating sources for heating the semiconductor devices during processing, the apparatus thereby only being capable of ashing at ambient temperatures.

16. The apparatus of claim 15, further comprising a second cathode coupled to the RF source, the second cathode being positioned so that the wafer is between the first cathode and the second cathode.

17. The apparatus of claim 15, wherein the first cathode is the only cathode enclosed in the chamber and coupled to the RF source.

18. The apparatus of claim 15, wherein the microwave energy source and the RF energy source are operable simultaneously so that an RF plasma is formed from the microwave generated gas.

* * * * *